United States Patent
Hong et al.

(10) Patent No.: US 6,757,210 B2
(45) Date of Patent: Jun. 29, 2004

(54) SEMICONDUCTOR MEMORY DEVICE

(75) Inventors: Sang Hoon Hong, Kyoungki-do (KR); Se Jun Kim, Kyoungki-do (KR); Jeong Hoon Kook, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/330,892

(22) Filed: Dec. 27, 2002

(65) Prior Publication Data

US 2004/0013025 A1 Jan. 22, 2004

(30) Foreign Application Priority Data

Jul. 19, 2002 (KR) .................................... 2002-42466

(51) Int. Cl.[7] .............................................. G11C 8/00
(52) U.S. Cl. .................................. 365/230.06; 365/239
(58) Field of Search .............................. 365/230.06, 239

(56) References Cited

U.S. PATENT DOCUMENTS

| | | | |
|---|---|---|---|
| 5,053,997 A | * 10/1991 | Miyamato et al. | ..... 365/189.06 |
| 5,404,338 A | 4/1995 | Murai et al. | ................. 365/233 |
| 5,764,590 A | 6/1998 | Iwamoto et al. | ............ 365/233 |
| 6,160,754 A | 12/2000 | Suh | ............................ 365/233 |

* cited by examiner

Primary Examiner—M. Tran
(74) Attorney, Agent, or Firm—Marshall, Gerstein & Borun LLP

(57) ABSTRACT

A semiconductor memory device configured to share a local I/O line is described herein. The device includes: a memory cell array including a plurality of memory cells; a plurality of bit line sense amplifiers configured to sense and to amplify data stored in the plurality of memory cells; a plurality of bit lines configured to transmit transmitting the data stored in the plurality of memory cells to the plurality of bit line sense amplifiers, respectively; a plurality of bit line dividing circuits configured to selectively divide the plurality of bit lines; and a plurality of column selecting circuits configured to sequentially transmit the data amplified by the plurality of bit line sense amplifiers to corresponding I/O lines.

6 Claims, 2 Drawing Sheets

SEMICONDUCTOR MEMORY DEVICE

TECHNICAL FIELD

The present disclosure relates to semiconductor memory devices, and more particularly, to a semiconductor memory device configured to share a local I/O (input/output) line.

BACKGROUND

A conventional memory core structure minimizes distance between memory cell arrays to maximize memory cell efficiency. In particular, the conventional memory core structure requires a maximum of 16 bits of data outputs, and thus shares a local I/O line.

On the other hand, a high speed memory such as a double data rate (DDR), a DDR-II and a graphic memory outputs a maximum of 32 bits of data. The high speed memory is required to have high speed burst operation, and thus the core must read data as many as a number of the bursts in advance. This function is a prefetch function. The DDR uses 2 bit prefetch and the DDR-II uses 4 bit prefetch. For example, the X16 DDR-II operates at 400MHz with 4 bursts, uses 4 bit prefetch, and reads 64 bits of data by one core access.

However, because the conventional core structure gradually increases an operation speed and widens a bandwidth, it cannot share the local I/O line. As a result, a spatial efficiency cannot be achieved.

SUMMARY OF THE DISCLOSURE

A semiconductor memory device configured to share a local I/O line by sequentially outputting data in a pipeline form is disclosed herein.

The semiconductor memory device includes: a memory cell array including a plurality of memory cells; a plurality of bit line sense amplifiers configured to sense and to amplify data stored in the plurality of memory cells; a plurality of bit lines configured to transmit the data stored in the plurality of memory cells to the plurality of bit line sense amplifiers, respectively; a plurality of bit line dividing circuits configured to selectively divide the plurality of bit lines; and a plurality of column selecting circuits configured to sequentially transmit the data amplified by the plurality of bit line sense amplifiers to corresponding I/O lines.

BRIEF DESCRIPTION OF THE DRAWINGS

The disclosure will be described in terms of several embodiments to illustrate its broad teachings. Reference is also made to the attached drawings.

DETAILED DESCRIPTION

The present disclosure will be described in detail with reference to the accompanying drawings.

Figure 1:
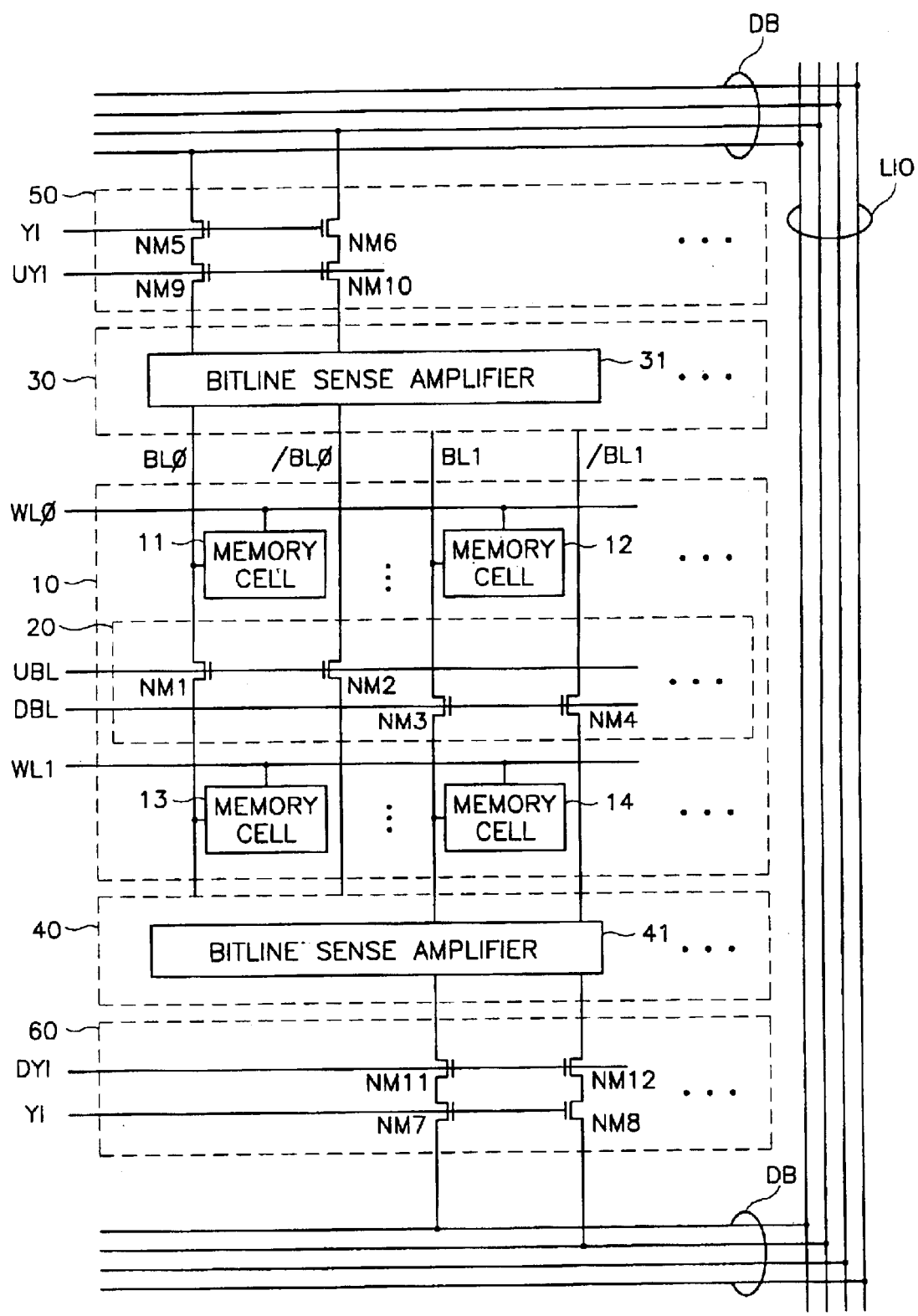
FIG. 1 is a block diagram illustrating a semiconductor memory device using a pipeline fetch structure.

FIG. 1 is a block diagram illustrating a semiconductor memory device 100 using a pipeline fetch structure. In the semiconductor memory device 100, a bit line dividing unit 20 is formed at the center portion of a memory cell array 10 composed of a plurality of memory cells 11, 12, 13 and 14. Sense amplifier arrays 30 and 40 composed of a plurality of sense amplifiers with two shown as 31 and 41, respectively, are connected to both ends of the memory cell array 10. Here, the bit line dividing unit 20 including NMOS transistors NM1, NM2, NM3 and NM4 that perform switching operation, according to an up bit line switching signal UBL and a down bit line switching signal DBL for dividing bit lines.

In the operation of reading data from memory cells 11 and 12 connected to an enabled word line WL0, the up bit line switching signal UBL is at a low level to turn off the NMOS transistors NM1 and NM2 when the data stored in the memory cell 11 connected to the upper sense amplifier array 30 are read. Accordingly, a length of the bit line pair BL and /BL is decreased and a bit line capacitance is reduced, and thereby improving sensing efficiency of the sense amplifiers.

On the other hand, when the data stored in the memory cell 12 connected to the lower sense amplifier array 40 are read, the down bit line switching signal DBL is at a high level to turn on the NMOS transistors NM3 and NM4. The bit line pair BL and /BL of the memory cell 12 positioned in the upper memory cell array 30 of the bit line dividing unit 20 is connected to the lower sense amplifier array 40. Accordingly, the reading speed of the data stored in the memory cell 11 connected to the upper sense amplifier array 30 is higher than that of the data stored in the memory cell 12 connected to the lower sense amplifier array 40 to sequentially perform the operations for reading the data stored in the two memory cells 11 and 12. As a result, local I/O line LIO can be shared by using the aforementioned operation property. To illustrate this concept, column selecting units 50 and 60 sequentially transmit the data amplified by the sense amplifiers 31 and 41 to the local I/O line LIO by using a column select signal YI, an up column select signal UYI and a down column select signal DYI.

To read the data from memory cells 11 and 12, the data stored in the memory cell 11 connected to the upper sense amplifier array 30 are transmitted to a bit line BL0. Here, the up bit line switching signal UBL becomes a low level to turn off the NMOS transistors NM1 and NM2.

The data on the bit line BL0 are sensed and amplified by the bit line sense amplifier 31. Here, the column select signal YI becomes a high level to turn on NMOS transistors NM5 and NM6. Accordingly, the data amplified by the bit line sense amplifier 31 are transmitted to the local I/O line LIO through a data bus DB. Here, the up column select signal UYI becomes a high level to turn on NMOS transistors NM9 and NM10 to form a path for outputting the data amplified by the bit line sense amplifier 31 to the data bus DB.

Thereafter, the data stored in the memory cell 12 connected to the lower sense amplifier array 40 are transmitted to a bit line BL1. The down bit line switching signal DBL becomes a high level to turn on the NMOS transistors NM3 and NM4. The data on the bit line BL1 are sensed and amplified by the bit line sense amplifier 41. Here, the column select signal YI becomes a high level to turn on NMOS transistors NM7 and NM8.

Therefore, the data are transmitted to the local I/O line LIO through the data bus DB. The down column select signal DYI becomes a high level to turn on NMOS transistors NM11 and NM12 to form a path for outputting the data amplified by the bit line sense amplifier 41 to the data bus DB.

Further, the data stored in the memory cell 14 connected to the lower sense amplifier array 40 are transmitted to the bit line BL1 to read the data from the memory cells 13 and 14 connected to an enabled word line WL1. The down bit line switching signal DBL becomes a low level to turn off the NMOS transistors NM3 and NM4.

The data on the bit line BL1 are sensed and amplified by the bit line sense amplifier 41. Here, the column select signal YI becomes a high level to turn on the NMOS transistors NM7 and NM8. Accordingly, the data amplified by the bit line sense amplifier 41 are transmitted to the local I/O line LIO through the data bus DB. The down column select signal DYI becomes a high level to turn on the NMOS transistors NM11 and NM12 to form a path for outputting the data amplified by the bit line sense amplifier 41 to the data bus DB.

Thereafter, the data stored in the memory cell 13 connected to the upper sense amplifier array 30 are transmitted to the bit line BL0. Here, the up bit line switching signal UBL becomes a high level to turn on the NMOS transistors NM1 and NM2. The data on the bit line BL0 are sensed and amplified by the bit line sense amplifier 31. The column select signal YI becomes a high level to turn on the NMOS transistors NM5 and NM6.

Therefore, the data are transmitted to the local I/O line LIO through the data bus DB. The up column select signal UYI becomes a high level to turn on the NMOS transistors NM9 and NM10 to form a path for outputting the data amplified by the bit line sense amplifier 31 to the data bus DB.

Figure 2A:
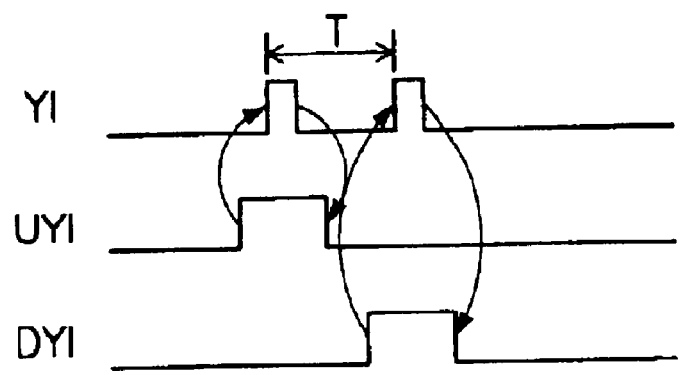
FIGS. 2a and 2b are timing diagrams of operation signals to explain the operation of the semiconductor memory device of FIG. 1.
Figure 2B:
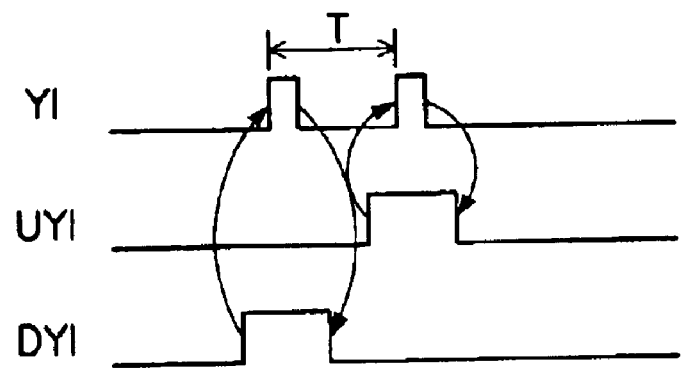

FIGS. 2a and 2b are timing diagrams of operation signals to explain the operation of the semiconductor memory device of FIG. 1. Here, the column select signal YI is inputted with a frequency twice as fast as the general column select signal, and a wave pipe delay time T has a time less than 10 nanoseconds.

FIG. 2a is a timing diagram of the read operation of the data stored in the memory cells 11 and 12 connected to the enabled world line WL0. The data stored in the memory cell 11 connected to the upper sense amplifier array 30 are transmitters the sense amplifier 31 through the bit line pair BL0 and /BL0, and the sense amplifier 31 senses and amplifies the data. The column select signal YI has a high level in a period when the up column select signal UYI is becomes a high level to transmit the data amplified by the sense amplifier 31 to the data bus DB.

Thereafter, the data stored in the memory cell 12 connected to the lower sense amplifier array 40 are transmitted to the sense amplifier 41 through the bit line pair BL1 and /BL1, and the sense amplifier 41 senses and amplifies the data. The column select signal YI has a high level in a period when the down column select signal DYI becomes a high level to transmit the data amplified by the sense amplifier 41 to the data bus DB.

FIG. 2b is a timing diagram of the read operation of the data stored in the memory cells 13 and 14 connected to the enabled world line WL1. The data stored in the memory cell 14 connected to the lower sense amplifier array 40 are transmitted to the sense amplifier 41 through the bit line pair BL1 and /BL1, and the sense amplifier 41 senses and amplifies the data. The column select signal YI has a high level in a period when the down column select signal DYI becomes a high level to transmit the data amplified by the sense amplifier 41 to the data bus DB.

Thereafter, the data stored in the memory cell 13 connected to the upper sense amplifier array 30 are transmitted to the sense amplifier 31 through the bit line pair BL0 and /BL0, and the sense amplifier 31 senses and amplifies the data. The column select signal YI has a high level in a period when the up column select signal UYI becomes a high level to transmit the data amplified by the sense amplifier 31 to the data bus DB.

As mentioned above, efficiency of the core structure is improved with the I/O bandwidth in the high speed memory device by using the pipeline fetch function. Moreover, the semiconductor memory device disclosed herein reduces the bit line capacitance and improves the sensing speed of the sense amplifiers by using the switch element for dividing the bit lines. Thus, the semiconductor memory device sequentially senses the data stored in the memory cells connected to the same word line with the sense amplifiers to share the local I/O line.

Many changes and modifications to the embodiments described herein could be made. The scope of some changes is discussed above. The scope of others will become apparent from the appended claims.

What is claimed is:

1. A semiconductor memory device comprising:
    a memory cell array including a plurality of memory cells;
    a plurality of bit line sense amplifiers configured to sense and to amplify data stored in the plurality of memory cells;
    a plurality of bit lines configured to respectively transmit the data stored in the plurality of memory cells to the plurality of bit line sense amplifiers;
    a plurality of bit line dividing circuits configured to selectively divide the plurality of bit lines; and
    a plurality of column selecting circuits configured to sequentially transmit the data amplified by the plurality of bit line sense amplifiers to corresponding I/O lines.

2. The device according to claim 1, wherein the bit line dividing circuits comprises a plurality of switch circuits.

3. The device according to claim 2, wherein at least one of the plurality of switch circuits positioned in one of the plurality bit line sense amplifiers connected to one of the plurality of memory cells is turn on.

4. The device according to claim 1, wherein the column selecting circuit comprises:
    a plurality of first switch circuits controlled according to a first column select signal generated by using a column address, the first column select signal having a first pulse width; and
    a plurality of second switch circuits respectively controlled according to a plurality of second column select signals having a second pulse width including the first pulse width.

5. The device according to claim 4, wherein the plurality of second switch circuits are sequentially turned on according to a distance between the selected memory cell and the bit line sense amplifier.

6. The device according to claim 4, wherein the plurality of second switch circuits are configured to selectively transmit the data amplified by the bit line sense amplifiers, and the plurality of first switch circuits are configured to selectively transmit the data selectively transmitted by the plurality of second switch circuits to the I/O line.

* * * * *